United States Patent
Fenk

(10) Patent No.: US 7,548,732 B2
(45) Date of Patent: Jun. 16, 2009

(54) POWER AMPLIFIER ARRANGEMENT HAVING TWO OR MORE ANTENNA COUPLING RESPECTIVE AMPLIFIERS TO A SUPPLY POTENTIAL

(75) Inventor: Josef Fenk, Eching/Ottenburg (DE)

(73) Assignee: Infineon Technologies AG, Munich (DE)

( * ) Notice: Subject to any disclaimer, the term of this patent is extended or adjusted under 35 U.S.C. 154(b) by 522 days.

(21) Appl. No.: 11/029,853

(22) Filed: Jan. 5, 2005

(65) Prior Publication Data
US 2005/0181751 A1  Aug. 18, 2005

(30) Foreign Application Priority Data
Jan. 7, 2004   (DE)   ............... 10 2004 001 236

(51) Int. Cl.
H04B 1/04 (2006.01)
(52) U.S. Cl. ............... 455/127.3; 330/124 R
(58) Field of Classification Search ........ 455/91–127.5, 455/129, 193.1, 272, 280, 292; 330/51, 124 R, 330/130
See application file for complete search history.

(56) References Cited

U.S. PATENT DOCUMENTS

| | | | |
|---|---|---|---|
| 4,598,252 A * | 7/1986 | Andricos | ............ 330/51 |
| 5,448,766 A | 9/1995 | Sanning et al. | |
| 5,903,854 A * | 5/1999 | Abe et al. | ............... 455/575.1 |
| 6,069,525 A * | 5/2000 | Sevic et al. | ............... 330/51 |
| 6,615,028 B1 * | 9/2003 | Loke et al. | ............... 455/127.1 |
| 6,775,525 B1 * | 8/2004 | Tanoue et al. | ............ 455/127.3 |
| 6,781,455 B2 * | 8/2004 | Kim | ............... 330/51 |
| 6,804,500 B2 * | 10/2004 | Yamaguchi | ............. 455/127.1 |
| 6,838,937 B2 * | 1/2005 | Fanous et al. | ........... 330/124 R |
| 2002/0111192 A1 * | 8/2002 | Thomas et al. | .............. 455/562 |

FOREIGN PATENT DOCUMENTS

EP    0 416 872 B1   3/1991

OTHER PUBLICATIONS

U.S. Appl. No. 11/029,099, filed Jan. 4, 2005, Josef Fenk.

* cited by examiner

Primary Examiner—Blane J Jackson
(74) Attorney, Agent, or Firm—Eschweiler & Associates, LLC

(57) ABSTRACT

A power amplifier arrangement having a distributed antenna is disclosed. The power amplifier arrangement has two or more signal paths which are coupled to a common input. Each signal path has an amplifier with a downstream antenna. The respective signal paths with the antenna are activated or deactivated by a control device as a function of the desired gain or output power. This results in high efficiency over a wide frequency range. The polar diagrams of the antenna branches preferably correspond to those of a single antenna.

19 Claims, 4 Drawing Sheets

POWER AMPLIFIER ARRANGEMENT HAVING TWO OR MORE ANTENNA COUPLING RESPECTIVE AMPLIFIERS TO A SUPPLY POTENTIAL

REFERENCE TO RELATED APPLICATIONS

This application claims the benefit of the priority date of German application DE 102004001236.9, filed on Jan. 7, 2004, the contents of which are herein incorporated by reference in their entirety.

FIELD OF THE INVENTION

The present invention relates to a power amplifier arrangement having an antenna, to use of the power amplifier arrangement in a radio transmission arrangement, and in a mobile radio, and to a method for amplification and emission of a signal.

BACKGROUND OF THE INVENTION

Power amplifier arrangements having an antenna are used, for example, in the transmission paths of mobile radios. Mobile radios are subject to an increasing requirement for a wider bandwidth in the radio-frequency signal processing. For example, mobile radios based on the GSM standard (Global System for Mobile Communication) nowadays normally already have three transmission and reception bands. Appliances such as these are also referred to as triband appliances. Accordingly, particularly at the end of the transmission path, where the power amplifier arrangement with the antenna is normally arranged, there is a requirement for these components to be designed with a particularly wide bandwidth. Even more frequency bands will be added in future mobile radio standards such as UMTS, Universal Mobile Telecommunications System, and WLAN, Wireless Local Area Network, so that an even wider bandwidth will be required.

Impedance matching must normally be carried out between the output of the power amplifier and the antenna. The increasing number of frequency bands means that the complexity of the impedance transformation from the impedance of the active power amplifier to the antenna impedance is becoming ever greater.

The amount of data being processed is also rising at the same time, in particular not only in the so-called download or downstream, that is to say from the base station to the mobile terminal, but in particular also in the opposite direction from the mobile terminal to the base station, that is to say upstream or in the upload. The power requirement of such mobile radios is accordingly also increasing continuously. It is therefore necessary to design the impedance matching between the antenna and the power amplifier not only to have a wider bandwidth, but also to provide more efficient power matching.

Transformation networks for impedance matching are nowadays normally designed with discrete inductances and capacitances. These components themselves in turn cause a not inconsiderable power loss:

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention is directed to a power amplifier arrangement having an antenna, which can be used in mobile radios and which is able to process a broad transmission signal bandwidth concurrently with high efficiency. The invention also includes a method for amplification and emission of a signal, which allows a wide bandwidth and high efficiency.

According to one embodiment of the invention, the power amplifier arrangement having an antenna comprises an input, a first signal path which is coupled to the input and which has a first amplifier, and a first antenna in the first signal path, which is coupled to one output of the first amplifier. The arrangement also comprises a second signal path and is coupled to the input and which has a second amplifier, and a second antenna in the second signal path, which is coupled to one output of the second amplifier. The arrangement further comprises a control device which is coupled to the first signal path and to the second signal path and is configured to activate and deactivate the first and the second amplifier as a function of a desired gain of the power amplifier arrangement.

With regard to another embodiment of the invention, a method for amplifying and emitting a signal comprises activating at least one of two or more amplifiers which are connected between an input and an output of a power amplifier arrangement, as a function of a desired gain for the signal, and activating at least one of two or more antennas which are respectively associated with the amplifiers, as a function of the desired signal gain. The method further comprises emitting the amplified signal by means of the activated amplifiers using the activated antennas.

According to one aspect of the present invention, rather than providing a discrete antenna component, the antenna function is distributed between two or more antennas or antenna branches. An antenna such as this can also be referred to as a distributed antenna. Furthermore, in one aspect of the invention the power amplifier is not in the form of a discrete power amplifier, but comprises two or more amplifiers. An amplifier such as this can be referred to as a distributed power amplifier.

The proposed combination of a distributed power amplifier with a distributed antenna in one embodiment of the invention results in a considerably wider bandwidth with losses being reduced at the same time, and thus in the power amplifier arrangement having an antenna being more efficient than conventional arrangements.

In one embodiment of the invention, there is no need to provide transformation between the amplifier output and the antenna for each antenna. In fact, the desired impedance matching or power matching can advantageously be achieved by suitable design of the capacitive and inductive characteristics of the antenna itself.

A bandwidth of, for example, 800 MHz to 2500 MHz can be achieved without any problems on the basis of the present invention.

The individual amplifiers may have a considerably higher output impedance than a single power amplifier. Skilful design of the individual antennas allows the losses which occur as a result of any matching network that may be present to be reduced considerably. It may even be possible to dispense completely with a matching network, depending on the design of the amplifiers and of the antennas.

In another embodiment of the invention, the maximum power to be emitted from the power amplifier, the so-called rated power, is not produced in a single, concentrated output stage and emitted using a single antenna. Rather, in this particular embodiment, a total of n stages are connected in parallel, and they are linked to the respective n antennas on the output side of the amplifier stages. In comparison to the conventional concentration of all of the power in one stage, which led to very low output impedances from the output stage and to transformation losses in the matching process, the present invention results in considerably better efficiency. The better efficiency is in this case achieved with a wider bandwidth.

In one embodiment of the invention one and only one antenna is associated with each amplifier. Alternatively, however, two antennas may also be provided for each amplifier, or two amplifiers for each antenna, or any other desired combinations and associations.

The distributed antennas, in one example, have the same emission characteristic, that is to say polar diagram, as one overall antenna. In this case, the antennas may be matched to one another in terms of their physical extent and arrangement. For example, the antennas may be in the form of quarter-lambda antenna elements arranged in parallel with one another.

The impedances of the first and second amplifier are, in one example, different from one another. The gain of the first and second amplifier may likewise be different from one another.

Two or more amplifiers may be provided, whose gains are graduated in binary intervals. Alternatively, the amplifiers may all have the same gain. The graduation of the amplifier gains may depend on the desired application.

The impedances of the first and second antennas are, in one example, different from one another.

A transformer converter is provided in one embodiment of the invention, and couples the input of the power amplifier arrangement to the first and to the second amplifier. The transformer converter may for this purpose have, for example, one primary winding and two secondary windings.

The transformer converter has, in one example, a control input which is connected to the control unit. The control input may be provided on each of the secondary windings of the converter, which are connected to the respective amplifiers.

The control input of the transformer converter may be a bias connection for supplying a bias signal for the first and/or second amplifier. The bias connection may also advantageously be used to switch the respective amplifier, including the antenna connected to it, on and off. This advantageously further reduces the power consumption.

The amplifiers are, in one embodiment, connected to a supply potential connection via the respective antenna connected to the amplifier, in order to supply them with power.

The power amplifier arrangement in another embodiment of the invention has two or more stages, that is to say it is designed to have at least one input and output stage. In this case, two or more output stages may advantageously have a common input stage. A transformer converter is provided for coupling the input stage to the output stages. A further transformer converter is likewise provided for coupling the input stage to the input of the amplifier arrangement.

When the arrangement is in the form of a multistage amplifier, at least one bypass signal path is provided, which has a single-stage amplifier with a downstream antenna and is connected directly to the input or the power amplifier arrangement. The bypass signal path is particularly suitable for amplification of signals with particularly low gain factors. Since only one amplifier stage need be operated in this case, the power consumption can be reduced even further.

The described power amplifier arrangement is designed using integrated circuitry, in one example. The circuit arrangement with the antenna is produced in a PCB, Printed Circuit Board, using a laminate technique.

The described power amplifier arrangement having an antenna can be used in a radio transmission arrangement or in a mobile radio.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention will be explained in more detail in the following text using a number of exemplary embodiments and with reference to the drawings, in which.

DETAILED DESCRIPTION OF THE INVENTION

Figure 1:
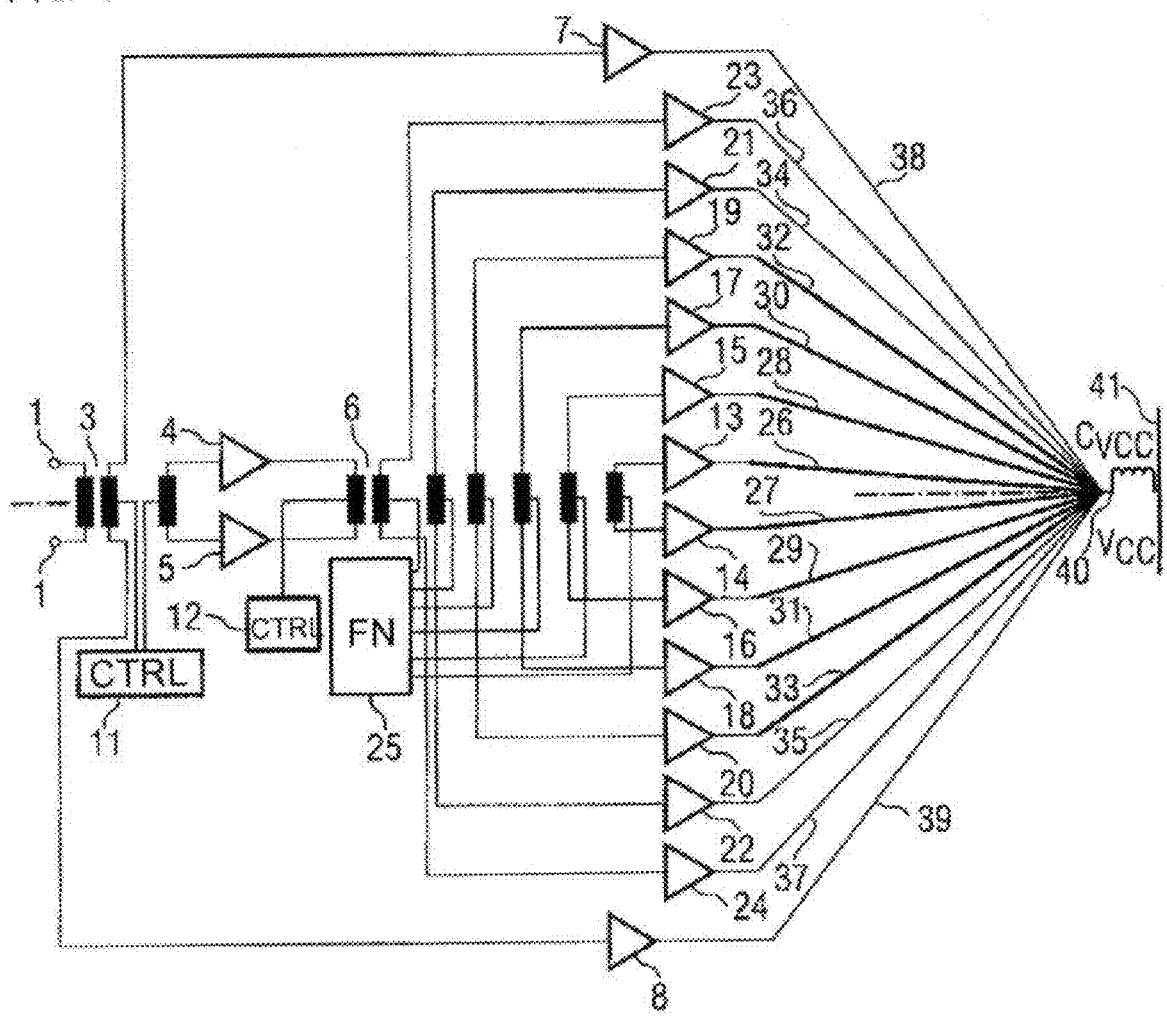
FIG. 1 is a circuit diagram illustrating an exemplary embodiment of a power amplifier arrangement having an antenna according to the present invention.

FIG. 1 shows a power amplifier arrangement having an input 1, which is balanced and is designed to carry difference signals. The primary of a radio-frequency transformer 3 is connected to the input 1. The secondary of the transformer 3 is connected via a respective input stage 4, 5 to the primary of a further radio-frequency transformer 6. The secondary of the transformer 3 is also connected to the input of a respective bypass amplifier 7, 8. A center tap on each of the two secondary windings of the transformer 3 is connected to a control block 11. A center tap on the primary of the transformer 6 is connected to a further control block 12.

A total of six secondary windings are provided on the secondary of the radio-frequency transformer 6, each having two connections to, in each case, one input of an amplifier 13 to 24. The amplifiers 13 to 24 are in this case each associated with one another in pairs. The six secondary windings of the transformer 6 are also connected via a respective center tap to a function block 25. The function blocks 11, 12, 25 together form a control unit. On the output side, one antenna 26, 27, 28, 29, 30, 31, 32, 33, 34, 35, 36, 37, 38, 39 is in each case connected to the bypass amplifiers 7, 8 and to the amplifiers 13 to 24. A further connection of each of the antennas 26 to 39 is coupled via a shunt capacitor and/or a series inductor 40 to a supply potential connection 41.

The control block 11 is designed to supply a bias voltage, which can in each case be switched on and off, for the bypass amplifiers 7, 8 and for the input stages 4, 5. The control block 12 is designed to supply a supply voltage for the amplifiers in the input stage 4, 5. The control block 25 is designed to supply in each case one bias voltage, which can be switched on and off independently of one another, for the amplifiers 13 to 24 and for the antennas 26 to 37 which are connected to them.

In each case in pairs and in conjunction with the input stage 4, 5, the amplifiers 13 to 20 each have a maximum output power of 500 mW. If all of the stages 13 to 20 are activated, this accordingly allows a maximum output power of 2 W. The amplifiers 21, 22 and 23, 24 are designed in pairs in conjunction with the input stage 4, 5 to produce a power of 100 mW each. The bypass amplifiers 7, 8 are provided in a power range from 3 mW to 30 mW.

When the power range up of 30 mW is activated, specifically by activation of the amplifiers 7, 8, provision is made for the other amplifiers 4, 5 as well as 13 to 24 to be switched off completely, so that the input signal for the low power range is amplified exclusively by the bypass amplifiers 7, 8. The bypass arrangement thus avoids the creation of unnecessary power losses in the stages 13 to 24 as well as the input stages 4, 5 during operation at a low output power.

The amplifiers 7, 8 as well as 13 to 24 have a relatively high output impedance. The respective antennas 26 to 39 are each actually matched to the associated amplifier output on the basis of power matching.

The emission characteristics of the distributed antennas 26 to 39, that is to say their overall polar diagrams, behave in the same way as a single, discrete overall antenna. However, the antennas 26 to 39 have a different impedance for each distributed branch, which is matched to the respective amplifier impedance. The output impedance of the amplifiers differs, at least in groups, owing to their different power classes. Wider metallization is chosen for the distributed amplifiers with low impedance 13 to 20 for the associated antennas 26 to 33, as is illustrated symbolically in FIG. 1. The metallization width for the amplifier stages with a lower gain and a higher impedance in this case decreases in steps.

The antennas 26 to 39 are illustrated only in the form of lines on the circuit diagram. However, the antennas are not arranged in the form of lines in the circuit layout or in their physical extents, but in fact are designed, by way of example, as λ/4 antenna elements or shortened λ/4 antenna elements, arranged in parallel with one another.

The inductive and capacitive characteristics of the antennas 26 to 39 can advantageously be set so as to ensure that the power is matched as well as possible to the amplifier impedance. There is therefore advantageously no need for transformation networks, in one example, or transformation networks can be provided using a considerably reduced number of components.

The proposed amplifier arrangement is suitable for a wide bandwidth. For example, signals can be amplified in the frequency range from 800 to 2500 MHz. The distributed power amplification also results in a considerably higher output impedance. In consequence, the efficiency is additionally improved over the entire frequency range and over the entire power range. The higher efficiency over the entire power range and the entire frequency range advantageously allow a mobile radio having the amplifier arrangement to be operated for considerably longer speech and standby times and/or with a smaller rechargeable battery capacity, and thus allow the mobile radio to be physically smaller with a lower weight.

Alternatively, the power amplifier arrangement may also be designed without being balanced. This is done by removing all of the components above the line of symmetry.

Figure 2:
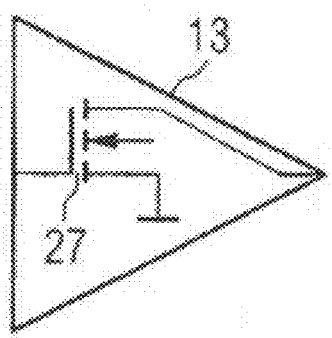
FIG. 2 illustrates an exemplary embodiment of the amplifiers shown in FIG. 1.

FIG. 2 shows an exemplary embodiment of the amplifiers 13 to 24 from FIG. 1, each having a field-effect transistor 27.

Figure 3:
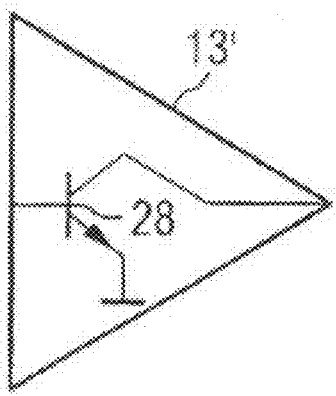
FIG. 3 illustrates another exemplary embodiment of the amplifiers shown in FIG. 1.

FIG. 3 shows an alternative embodiment of the amplifiers 13 to 24 with a bipolar transistor 28.

Figure 4:
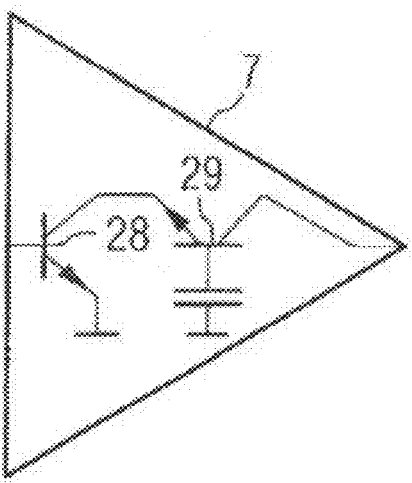
FIG. 4 illustrates yet another exemplary embodiment of the amplifiers shown in FIG. 1.

FIG. 4 shows the bypass amplifiers 7, 8 with a bipolar transistor 28 and a downstream cascode stage 29. The cascode stage 29 improves the stability of the multistage amplifier, and additionally improves its backward isolation.

Figure 5:
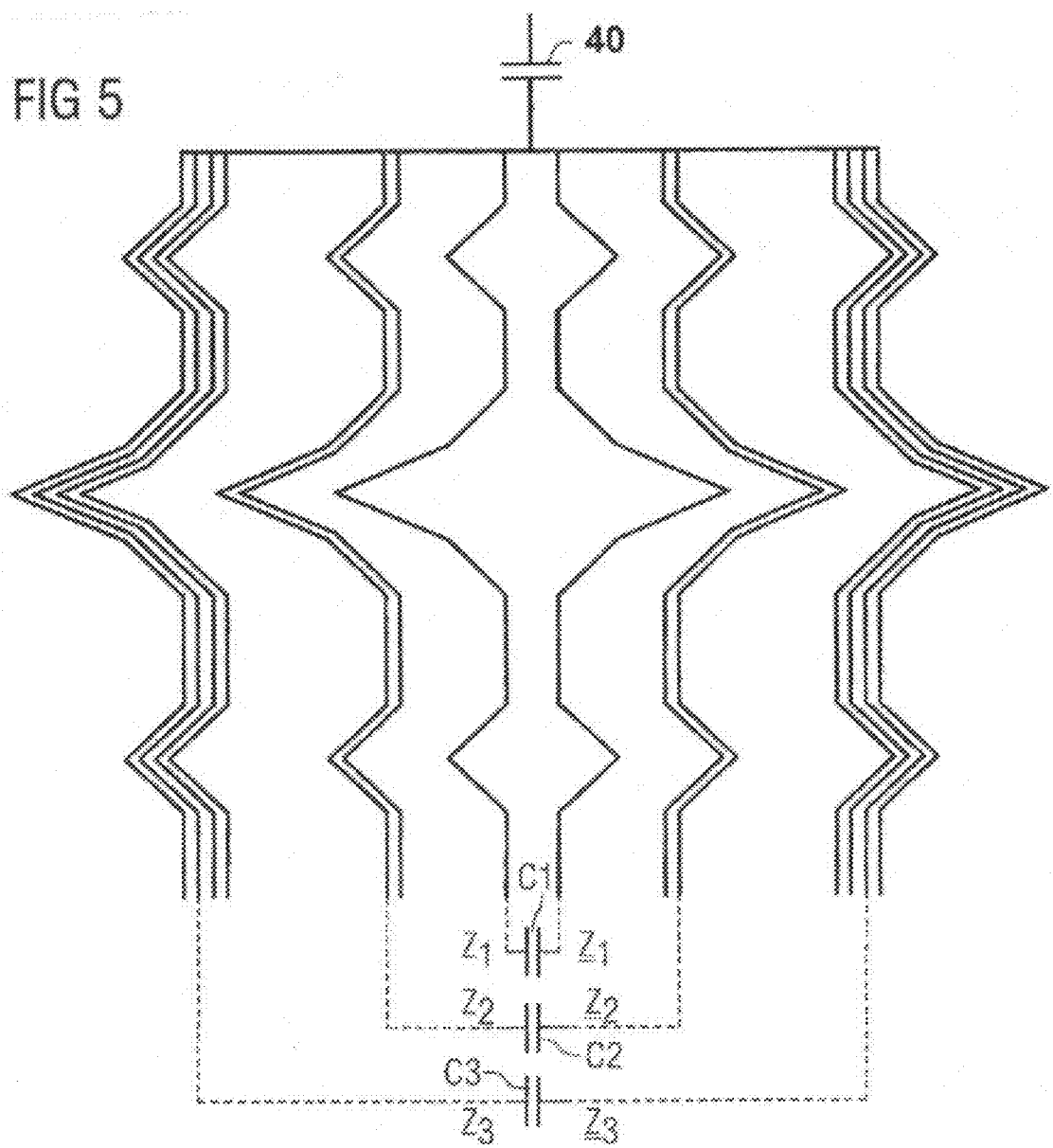
FIG. 5 illustrates an exemplary embodiment of a distributed antenna for use with the circuit shown in FIG. 1.

FIG. 5 shows an exemplary embodiment of a distributed antenna with the respective metallization paths for use in the circuit shown in FIG. 1. The fractal antenna shown in FIG. 5 acts as an antenna although only those antenna branches for which the upstream amplifier is also actually activated are in each case excited. The attenuation resulting from the respectively non-activated antenna branches is in this case negligibly small. The fractal antenna shown in FIG. 5 is based on a so-called Koch curve with a relatively shallow iteration depth.

Other distributed antenna concepts than that shown in FIG. 5 may, of course, also be used in accordance with the present invention.

Figure 6:
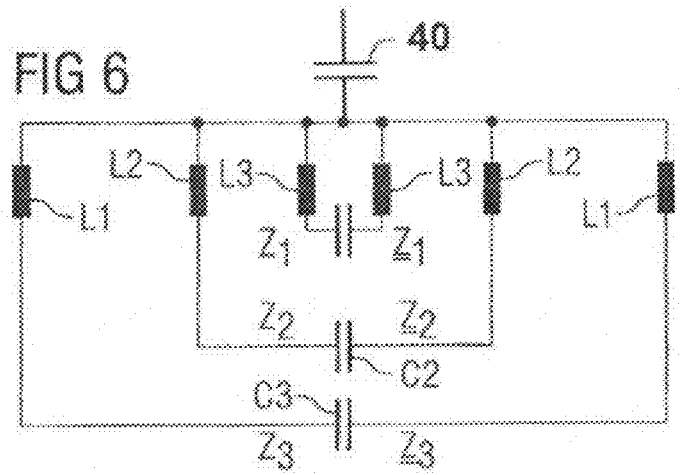
FIG. 6 is a circuit diagram illustrating an equivalent circuit of the antenna shown in FIG. 5.

By way of example, FIG. 6 shows an equivalent circuit of the distributed antenna from FIG. 5 with inductances L1, L2, L3, complex impedances Z1, Z2, Z3 and capacitances C1, C2, C3. The inductances L1 to L3 and the capacitances C1 to C3 being set in a suitable form in each case allows good power matching to the output impedance of the upstream amplifier from FIG. 1.

Figure 7:
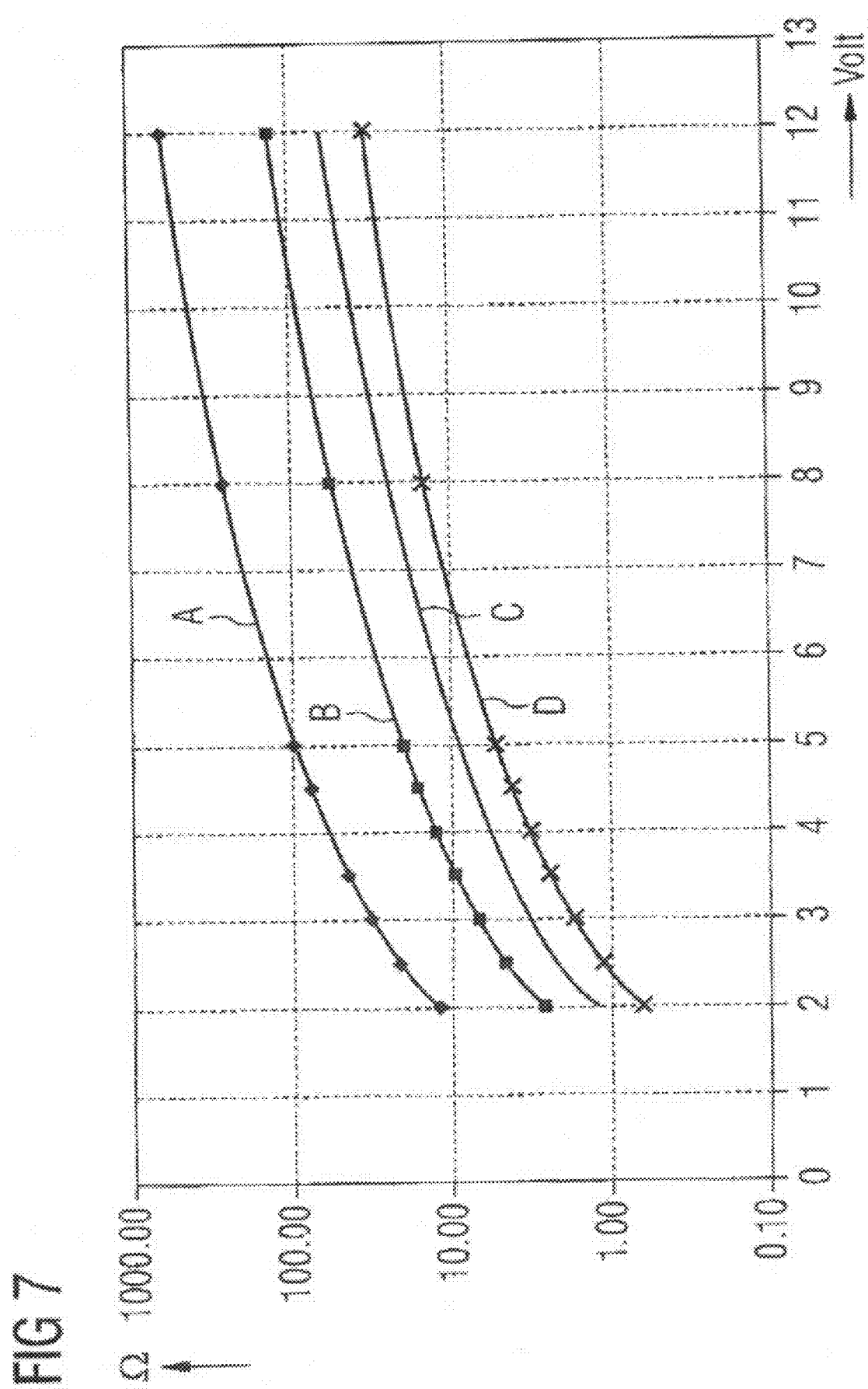
FIG. 7 is a graph illustrating a profile of the output impedance plotted against the supply voltage of the amplifier arrangement according to the present invention.

FIG. 7 shows a graph in which the output impedance in ohms is plotted against the supply voltage in volts. The graph applies to a Class A power amplifier with an output power from 0.1 to 2 W. The curve for 0.1 W is annotated A, the curve for 0.5 W is annotated B, the curve for 1.0 W is annotated C and the curve for 2 W is annotated D. This shows that the output impedance increases as the supply voltage for the amplifiers becomes higher.

It is, of course, within the scope of the invention for the illustrated power amplifier arrangement having an antenna to also be designed with fewer or more signal paths, that is to say with fewer or more amplifier and antenna branches. Furthermore, alternatively, one group of antenna branches can also be associated with each amplifier. It is also within the scope of the invention for the amplifiers to be graduated differently, for example in a binary form.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A power amplifier arrangement, comprising:
   an input;
   a first signal path coupled to the input and comprising a first amplifier;
   a first antenna in the first signal path coupled to one output of the first amplifier;
   a second signal path coupled to the input and comprising a second amplifier;
   a second antenna in the second signal path coupled to one output of the second amplifier; and
   a control device coupled to the first signal path and the second signal path, and configured to selectively activate and deactivate the first and second amplifiers as a function of a desired gain of the power amplifier arrangement,
   the first and the second amplifiers coupled to a supply potential connection at an output via the respecively associated first and second antennas.

2. The power amplifier arrangement of claim 1, wherein the first antenna and the second antenna are configured such that a polar diagram collectively associated therewith corresponds to a polar diagram of a single antenna.

3. The power amplifier arrangement of claim 1, wherein an impedance of the first antenna and an impedance of the second antenna are different from one another.

4. The power amplifier arrangement of claim 1,
   wherein an impedance of the first antenna is matched to an impedance of the first amplifier on the basis of power matching, and
   wherein an impedance of the second antenna is matched to an impedance of the second amplifier on the basis of power matching.

5. The power amplifier arrangement of claim 1, further comprising a transformer converter configured to selectively couple the first and the second amplifiers to the input of the power amplifier arrangement.

6. The power amplifier arrangement of claim 5, wherein the transformer converter comprises a control input connected to the control device, and is configured to switch the first or second amplifier, or both, on and off based on a state of the control input.

7. The power amplifier arrangement of claim 5, wherein the transformer converter comprises a bias connection connected to the control device, and is configured to supply a bias signal to the first or second amplifier, or both, based on a state of the bias connection.

8. The power amplifier arrangement of claim 1, wherein the power amplifier arrangement is designed using balanced circuitry, wherein the first amplifier comprises two first sub-amplifiers coupled together in parallel, the first antenna comprises two first sub-antennas respectively connected to the two first sub-amplifiers, and the second amplifier comprises two second sub-amplifiers coupled together in parallel, and the second antenna comprises two second sub-antennas respectively connected to the two second sub-amplifiers.

9. The power amplifier arrangement of claim 1, wherein the first and the second amplifiers each comprise at least one field-effect transistor or one bipolar transistor operable for signal amplification.

10. The power amplifier arrangement of claim 1, wherein the first and the second amplifiers each comprise at least one transistor for signal amplification, with an associated cascode stage coupled thereto.

11. The power amplifier arrangement of claim 1, wherein the first and second amplifiers form a first amplifier stage, and further comprising a second amplifier stage coupled in series with the first amplifier stage.

12. The power amplifier arrangement of claim 11, wherein further comprising a bypass signal path coupled to the input, and comprising a single-stage amplifier coupled to a downstream antenna.

13. An amplifier arrangement, comprising:
    a first signal path extending between an intermediate input and an output of the arrangement, and comprising a first amplifier and a first antenna serially coupled thereto;
    a second signal path coupled in parallel with the first signal path, and comprising a second amplifier and a second antenna serially coupled thereto, wherein the first and second signal paths comprise a first amplifier stage;
    a second amplifier stage connected in series with the first amplifier stage between an input of the arrangement and the intermediate input;
    a bypass signal path extending between the input and the output, and comprising a bypass amplifier and a by pass antenna; and
    a control unit operably coupled to the first, second and bypass signal paths, and configured to selectively activate or deactivate the first, second or by pass amplifiers as a function of a desired gain of the amplifier arrangement.

14. The amplifier arrangement of claim 13, further comprising a transformer system at the intermediate input, wherein the transformer system is operable to couple the first and second amplifier stages.

15. The amplifier arrangement of claim 14, wherein an impedance of the first and second antennas are different, and wherein the impedance of the first and second antennas match an impedance of the first and second amplifiers, respectively.

16. A method for amplifying and emitting a signal, comprising:
    activating at least one of two or more amplifiers which are connected between an input and an output of a power amplifier arrangement, as a function of a desired gain for the signal;
    activating at least one of two or more antennas which are respectively associated with the amplifiers, as a function of the desired signal gain, the two or more antennas coupling respective amplifiers to a supply potential at the output;
    amplifying the signal at the input with the activated amplifiers; and
    emitting the amplified signal at the output using the activated antennas.

17. The method of claim 16, wherein the antennas employed in emitting the amplified signal collectively have a polar diagram associated therewith that corresponds to a polar diagram of a single antenna.

18. The method of claim 16, further comprising impedance matching of the two or more antennas to the respective amplifiers associated therewith.

19. The method of claim 16, further comprising inductive coupling the amplified signal, which has been amplified by the two or more amplifiers, to the two or more antennas.

* * * * *